(12) United States Patent
Moeggenborg et al.

(10) Patent No.: US 8,691,695 B2
(45) Date of Patent: *Apr. 8, 2014

(54) CMP COMPOSITIONS AND METHODS FOR SUPPRESSING POLYSILICON REMOVAL RATES

(75) Inventors: Kevin Moeggenborg, Naperville, IL (US); William Ward, Glen Ellyn, IL (US); Ming-Shih Tsai, Jhudong Township (TW); Francesco De Rege Thesauro, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 13 days.

This patent is subject to a terminal disclaimer.

(21) Appl. No.: 13/379,911

(22) PCT Filed: Jun. 18, 2010

(86) PCT No.: PCT/US2010/039118
§ 371 (c)(1),
(2), (4) Date: Dec. 21, 2011

(87) PCT Pub. No.: WO2011/005456
PCT Pub. Date: Jan. 13, 2011

(65) Prior Publication Data
US 2012/0094489 A1    Apr. 19, 2012

Related U.S. Application Data

(60) Provisional application No. 61/219,031, filed on Jun. 22, 2009.

(51) Int. Cl.
| | |
|---|---|
| *H01L 21/302* | (2006.01) |
| *B44C 1/22* | (2006.01) |
| *H01L 21/3105* | (2006.01) |
| *H01L 21/321* | (2006.01) |
| *C09K 3/14* | (2006.01) |
| *C09G 1/02* | (2006.01) |

(52) U.S. Cl.
CPC ...... *H01L 21/31053* (2013.01); *H01L 21/3212* (2013.01); *C09K 3/1463* (2013.01); *C09G 1/02* (2013.01)
USPC ............... 438/693; 438/692; 216/88; 216/89; 216/90

(58) Field of Classification Search
CPC ..................... H01L 21/31053; H01L 21/3212; C09G 1/02; C09K 3/1463
USPC .......................... 438/692, 693; 216/88, 89, 90
See application file for complete search history.

(56) References Cited

U.S. PATENT DOCUMENTS

| | | | |
|---|---|---|---|
| 6,270,393 B1 * | 8/2001 | Kubota et al. | 451/36 |
| 6,936,543 B2 | 8/2005 | Schroeder et al. | |
| 6,974,777 B2 | 12/2005 | Moeggenborg et al. | |
| 6,979,252 B1 * | 12/2005 | Siddiqui et al. | 451/60 |
| 8,138,091 B2 * | 3/2012 | Dysard et al. | 438/692 |
| 2006/0024967 A1 * | 2/2006 | De Rege Thesauro et al. | 438/692 |
| 2007/0181534 A1 | 8/2007 | Kamimura | |
| 2007/0209287 A1 | 9/2007 | Chen et al. | |
| 2007/0298612 A1 | 12/2007 | Dysard et al. | |
| 2009/0227115 A1 * | 9/2009 | Kato et al. | 438/753 |
| 2009/0298290 A1 * | 12/2009 | Kamimura | 438/693 |
| 2011/0250756 A1 * | 10/2011 | Uchikura et al. | 438/693 |
| 2012/0094487 A1 * | 4/2012 | Kranz et al. | 438/692 |

* cited by examiner

*Primary Examiner* — Shamim Ahmed
(74) *Attorney, Agent, or Firm* — Thomas E Omholt; Robert J Ross; Steven D Weseman

(57) ABSTRACT

The present invention provides a chemical-mechanical polishing (CMP) composition suitable for polishing a silicon nitride-containing substrate while suppressing polysilicon removal from the substrate. The composition comprises abrasive particles suspended in an acidic aqueous carrier containing a surfactant comprising an alkyne-diol, an alkyne diol ethoxylate, or a combination thereof. Methods of polishing a semiconductor substrate therewith are also disclosed.

6 Claims, 4 Drawing Sheets

SURFYNOL® 104

SURFYNOL® DF110D

SURFYNOL® 61

CMP COMPOSITIONS AND METHODS FOR SUPPRESSING POLYSILICON REMOVAL RATES

FIELD OF THE INVENTION

This invention relates to chemical-mechanical polishing (CMP) compositions and methods. More particularly, this invention relates to methods for polishing semiconductor substrates while suppressing polysilicon removal from the substrates

BACKGROUND OF THE INVENTION

Compositions and methods for chemical-mechanical polishing of the surface of a substrate are well known in the art. Polishing compositions (also known as polishing slurries, CMP slurries, and CMP compositions) for CMP of surfaces of semiconductor substrates (e.g., integrated circuits) typically contain an abrasive, various additive compounds, and the like.

In general, CMP involves the concurrent chemical and mechanical abrasion of surface, e.g., abrasion of an overlying first layer to expose the surface of a non-planar second layer on which the first layer is formed. One such process is described in U.S. Pat. No. 4,789,648 to Beyer et al. Briefly, Beyer et al., discloses a CMP process using a polishing pad and a slurry to remove a first layer at a faster rate than a second layer until the surface of the overlying first layer of material becomes coplanar with the upper surface of the covered second layer. More detailed explanations of chemical mechanical polishing are found in U.S. Pat. No. 4,671,851, U.S. Pat. No. 4,910,155 and U.S. Pat. No. 4,944,836.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing, agents, acids, bases, or other additives present in the CMP composition) and/or the mechanical activity of an abrasive suspended in the polishing composition. Typical abrasive materials include silicon dioxide, cerium oxide, aluminum oxide, zirconium oxide, and tin oxide.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

A semiconductor wafer typically includes a substrate, such as silicon or gallium arsenide, on which a plurality of transistors has been formed. Transistors are chemically and physically connected to the substrate by patterning regions in the substrate and layers on the substrate. The transistors and layers are separated by interlevel dielectrics (ILDs), comprised primarily of some form of silicon oxide ($SiO_2$). The transistors are interconnected through the use of well-known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (Poly-Si), and various combinations thereof. In addition, transistors or groups of transistors are isolated from one another, often through the use of trenches filled with an insulating material such as silicon dioxide, silicon nitride, and/or polysilicon.

The traditional technique for forming interconnects has been improved by the method disclosed in U.S. Pat. No. 4,789,648 to Chow et al., which relates to a method for producing coplanar multilevel metal/insulator films on a substrate. This technique, which has gained wide interest and produces multilevel interconnects, uses chemical mechanical polishing to planarize the surface of the metal layers or thin-films during the various stages of device fabrication.

Although many of the known CMP slurry compositions are suitable for limited purposes, the conventional tend to exhibit unacceptable polishing rates and corresponding selectivity levels to insulator materials used in wafer manufacture. In addition, known polishing slurries tend to produce poor film removal traits for the underlying films or produce deleterious film-corrosion, which leads to poor manufacturing yields.

Co-owned U.S. patent application Ser. No. 11/374,238 to Chen et al. describes novel polishing compositions having a pH of 1 to 6 including an abrasive in combination with certain acidic components (e.g., combinations of malonic acid and an aminocarboxylic acid; stannate salts; uric acid; phenylacetic acid; or combinations of malonic acid, an aminocarboxylic acid, and sulfate) to polish silicon nitride substrates.

Co-owned U.S. patent application Ser. No. 11/448,205 to Dysard et al. describes novel polishing compositions having an acidic pH and including at least one additive having a pKa in the range of 1 to 4.5 to polish silicon nitride substrates.

As the technology for integrated circuit devices advances, traditional materials are being used in new and different ways to achieve the level of performance needed for advanced integrated circuits. In particular, silicon nitride, silicon oxide, and polysilicon are being used in various combinations to achieved new and ever more complex device configurations. In general, the structural complexity and performance characteristics vary across different applications. In some cases, conditions suitable for effective removal of one component of a substrate, such as silicon nitride, can undesirably lead to over-removal of another component, such as polysilicon.

Accordingly, there is a continuing need for CMP compositions and methods to achieve acceptable removal rates of silicon nitride, silicon oxide or tungsten for many IC device applications, while suppressing polysilicon removal. The present invention provides such improved polishing methods and compositions. These and other advantages of the invention, as well as additional inventive features, will be apparent from the description of the invention provided herein.

BRIEF SUMMARY OF THE INVENTION

The present invention provides CMP compositions useful for selectively polishing a semiconductor substrate to remove a component such as a silicon nitride, silicon oxide or tungsten from the surface of the substrate while suppressing polysilicon removal. A CMP composition of the invention comprises abrasive particles suspended in an acidic aqueous carrier containing a surfactant comprising an alkyne diol and or an alkyne diol ethoxylate (preferably an alkyne diol). In a preferred embodiment, a CMP composition of the invention comprises 0.01 to 15 percent by weight abrasive particles suspended in an acidic aqueous carrier containing 10 to 10,000 ppm of the surfactant. In some preferred embodiments, the abrasive particles comprise colloidal silica. Preferably, the acidic aqueous carrier has a pH value of not more than 6 (e.g., 1 to 4, or 2 to 3). The surfactant preferably is present in an amount in the range of 20 to 1,000 ppm. If desired, the compositions of the invention can include other additive materials such as a carboxylic acid material (e.g., malonic acid and/or glycine) and/or an organic or inorganic salt (e.g. potassium sulfate). For example, the composition can comprise 10 to 100,000 ppm (0.001 to 10 percent by weight) of at least one carboxylic acid material. The CMP compositions can also include other common additive materials utilized in CMP compositions, such as biocides, viscosity modifiers, corrosion inhibitors, chelating agents, organic polymers, other surfactants, oxidizing agents, electron transfer agents, and the like, many examples of which are well known in the CMP art.

In another aspect, the present invention provides a method for polishing a substrate to remove a component such as silicon nitride, silicon oxide or tungsten in preference to polysilicon. The method comprises abrading a surface of the substrate with a CMP composition of the present invention, preferably in the presence of hydrogen peroxide. The abrading can be accomplished, for example, by contacting a surface of the substrate with a polishing pad and the CMP composition, and causing relative motion between the polishing pad and the substrate while maintaining a portion of the CMP composition in contact with the surface between the pad and the substrate for a time period sufficient to abrade silicon nitride from the surface.

The CMP compositions of the present invention provide effective removal rates of silicon nitride, silicon oxide or tungsten while unexpectedly suppressing polysilicon removal in comparison to the results obtained with substantially the same formulation in the absence of the alkyne diol or alkyne diol ethoxylate surfactant.

DETAILED DESCRIPTION OF THE INVENTION

A CMP composition of the invention comprises abrasive particles suspended in an acidic aqueous carrier containing a surfactant comprising an alkyne-diol and/or alkyne diol ethoxylate.

Preferred alkyne diol surfactants comprise an alkyne diol compound of Formula (I) or an ethoxylate thereof comprising 1 to 40 moles (preferably 4 to 30 moles) of ethyleneoxy units per mole of alkyne diol compound.
Formula (I):

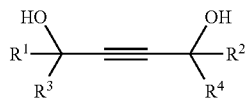

wherein each of $R^1$ and $R^2$ is independently H or methyl; and each of $R^3$ and $R^4$ is independently a $C_1$ to $C_{22}$ alkyl group (e.g., a linear or branched alkyl group). In some preferred embodiments $R^1$ and $R^2$ are both methyl. Preferably, at least one of $R^3$ and $R^4$ is a branched aliphatic hydrocarbon moiety (e.g., 2-methylpropyl). As used herein, the term "ethoxylate" refers to a compound of Formula (I) in which one or both of the OH groups of Formula (I) is replaced by a $(CH_2CH_2O)_n$—$CH_2H_2OH$ group in which "n" is 0 or greater, and the total number of moles of EO per mole of diol compound is the sum of (n+1) for each ethoxylate chain in the compound. In some preferred embodiments, the surfactant comprises an alkyne diol compound rather than an alkyne diol ethoxylate.

Figure 1:
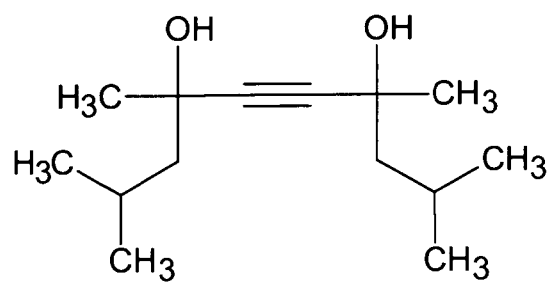
FIG. 1 illustrates the structures of two alkyne diol surfactants useful in the compositions and methods of the present invention along with the structure of a comparative alkyne monoalcohol surfactant.
Figure 1:
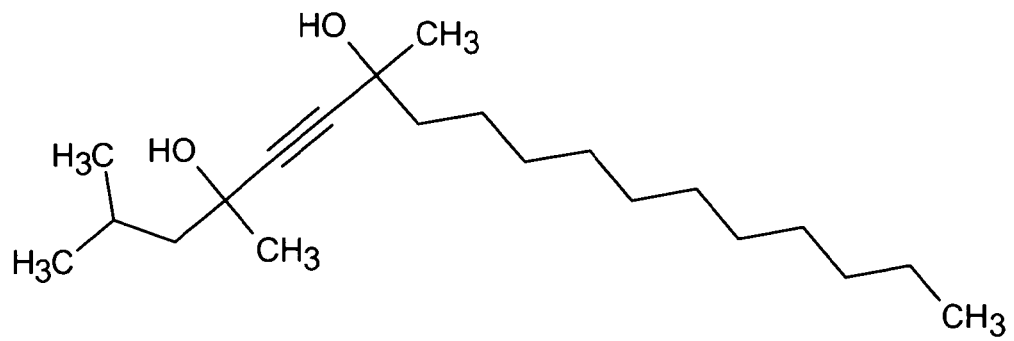
Figure 1:
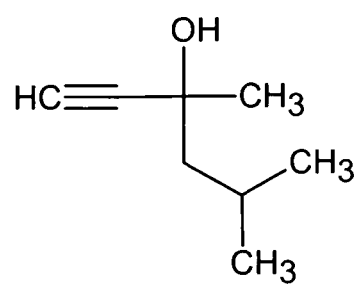

FIG. 1 illustrates two examples of commercial SURFYNOL® brand alkyne diol surfactants of Formula (I) useful in the compositions and method of the present invention, i.e., 2,4,7,9-tetramethyldec-5-yne-4,7-diol (SURFYNOL® 104) and 2,4,7-trimethyloctadec-5-yne-4,7-diol (SURFYNOL® DF110D), available from Air Products and Chemicals, Inc., as well as a comparative alkyne monoalcohol surfactant, i.e., 3,5-dimethylhex-1-yne-3-ol (SURFYNOL® 61). Another suitable alkyne diol-containing surfactant is 2,5,8,11-tetramethyldodec-6-yne-5,8-diol (SURFYNOL® 124). Non-limiting examples of suitable surfactants containing an ethoxylated alkyne diol compound include SURFYNOL® 440 (2,4,7,9-tetramethyldec-5-yne-4,7-diol ethoxylated with 3.5 moles of EO per mole of diol), SURFYNOL® 465 (2,4,3,9-tetramethyldec-5-yne-4,7-diol ethoxylated with 10 moles of EO per mole of diol), SURFYNOL® 485 (2,4,7,9-tetramethyldec-5-yne-4,7-diol ethoxylated with 30 mole of EO per mole of diol); and DYNOL® 604 (2,5,8,11-tetramethyldodec-6-yne-5,8-diol ethoxylated with 4 mole of EO per mole of diol).

Any suitable abrasive particles can be utilized in the CMP compositions and methods of the present invention. As used herein the terms "abrasive" and abrasive particles" are used interchangeably to refer to particulate materials that are capable of abrading a surface of a substrate wafer comprising a semiconductor material and one or more other materials such as a metal, a dielectric material, and the like, such as are used in the manufacture of IC devices. Non-limiting examples of such abrasives include silicon dioxide (silica), aluminum oxide (alumina), titanium dioxide (titania), cerium oxide (ceria), zirconium oxide (zirconia), and the like. Colloidal silica is a preferred abrasive. The abrasive preferably is present in the polishing composition at a concentration in the range of 0.01 to 15 percent by weight (wt %), e.g., 0.05 to 8 wt %, or 0.1 to 5 wt %. In some preferred embodiments, the abrasive comprises colloidal silica particles having a mean particle size in the range of 1 nm to 500 nm, more preferably 10 nm to 200 nm, as determined by laser light scattering techniques, which are well known in the art.

The abrasive desirably is suspended in the polishing composition, more specifically in the aqueous carrier component of the polishing composition. When the abrasive is suspended in the polishing composition, it preferably is colloidally stable. The term "colloid" refers to the suspension of abrasive particles in the liquid carrier. "Colloidal stability" refers to the maintenance of that suspension over time. In the context of this invention, an abrasive suspension is considered colloidally stable if, when the silica is placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., $([B]-[T])/[C] \leq 0.5$). The value of $([B]-[T])/[C]$ desirably is less than or equal to 0.3, and preferably is less than or equal to 0.1.

As used herein and in the appended claims, the term "colloidal silica" refers to silicon dioxide that has been prepared by condensation polymerization of $Si(OH)_4$. The precursor $Si(OH)_4$ can be obtained, for example, by hydrolysis of high purity alkoxysilanes, or by acidification of aqueous silicate solutions. Such colloidal silica can be prepared in accordance with U.S. Pat. No. 5,230,833 or can be obtained as any of various commercially available products, such as the Fuso PL-1, PL-2, and PL-3 products, and the Nalco 1050, 2327, and 2329 products, as well as other similar products available from DuPont, Bayer, Applied Research, Nissan Chemical, and Clariant.

The aqueous carrier preferably comprises, consists essentially of or consists of water (e.g., deionized water) containing an acidic substance dissolved therein at a concentration sufficient to provide an acidic pH, preferably not more than pH 6 (e.g., a pH in the range of 1 to 4). The acidic substance can be an acid or a buffering material (e.g., an acid, acidic salt, or a mixture of an acid and a salt). Acids and buffering materials suitable for use in CMP compositions are well known in the art. Optionally, the aqueous carrier can include water soluble or water miscible organic materials such as alcohols, glycols, and the like.

In addition, the aqueous carrier can include other functional materials commonly included in CMP compositions, such as carboxylic acid materials, carboxylic acid salts, inorganic salts, corrosion inhibitors, biocides, viscosity modifiers, chelating agents, and the like, many examples of which are well known in the CMP art.

In some preferred embodiments, the CMP composition includes a carboxylic acid material in the aqueous carrier at a concentration in the range of 0.001 to 10 wt % (10 ppm to 100,000 ppm; e.g. 100 to 5,000 ppm, or 500 to 2,000 ppm), based on the total composition weight.

Non-limiting examples of suitable carboxylic acid materials include, monocarboxylic acids (e.g., benzoic acid, phenylacetic acid, 1-naphthoic acid, 2-naphthoic acid, glycolic acid, formic acid, lactic acid, mandelic acid, and the like), polycarboxylic acids (e.g., oxalic acid, malonic acid, succinic acid, adipic acid, tartaric acid, citric acid, maleic acid, fumaric acid, aspartic acid, glutamic acid, phthalic acid, isophthalic acid, terephthalic acid, 1,2,3,4-butanetetracarboxylic acid, itaconic acid, and the like), and amino acids such as glycine.

The compositions and methods of the invention provide useful silicon nitride removal rates over a wide range of pH, abrasive concentration, and surfactant concentration, while unexpectedly suppressing, polysilicon removal. In some particularly preferred embodiments, the silicon nitride removal rate is 250 Angstroms per minute (Å/min) or greater when polishing a silicon nitride blanket wafer with a Epic® D100 polishing pad (Cabot Microelectronics Corporation, Aurora, Ill.) on a table-top CMP polisher at a down force of 2 pounds per square inch (psi), a platen speed of 115 revolutions per minute (rpm), a carrier speed of 60 rpm, and a polishing slurry flow rate of 125 milliliters per minute (mL/min), in the presence of hydrogen peroxide (1 wt %). Surprisingly, the polysilicon removal rate obtained by polishing a polysilicon wafer under the same conditions generally is not more than 80% of the silicon nitride removal rate, often not more than 70% or not more than 60% of the silicon nitride removal rate. Typically, the polysilicon removal rate obtained with a CMP composition of the present invention will be at least 10% lower (preferably at least 20%, 30%, 40% or 50% lower) than the polysilicon rate obtained with a CMP composition substantially identical to the composition of the invention, but lacking the alkyne diol or alkyne diol ethoxylate surfactant.

The polishing compositions of the invention optionally can include one or more oxidizing agent (e.g., to oxidize a component of the semiconductor surface, such as a metal component). Oxidizing agents suitable for use in the polishing compositions and methods of the present invention include, without limitation hydrogen peroxide, persulfate salts (e.g., ammonium monopersulfate, ammonium dipersulfate, potassium monopersulfate, and potassium dipersulfate), periodate salts (e.g., potassium periodate), salts thereof, and a combination of two or more of the foregoing. Preferably, the oxidizing agent is added to the composition in an amount sufficient to oxidize one or more selected metallic or semiconductor material present in the semiconductor wafer, as is well known in the semiconductor CMP art.

The polishing compositions of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, surfactant, acids, bases, buffers, oxidizing agents, and the like), as well as any combination of ingredients. For example, the abrasive can be dispersed in water, and the surfactant and any other additive material can be added, and mixed by any method that is capable of incorporating the components into the polishing composition. Typically, an oxidizing agent, when utilized, is not added to the polishing composition until the composition is ready for use in a CMP process, for example, the oxidizing agent can be added just prior to initiation of polishing. The pH can be further adjusted at any suitable time by addition of an acid or base, as needed.

The polishing compositions of the present invention also can be provided as a concentrate, which is intended to be diluted with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The invention also provides a method of chemically-mechanically polishing a silicon nitride substrate. The method comprises abrading a surface of a silicon nitride- and polysilicon-containing substrate with a polishing composition of the invention as described herein.

The polishing compositions of the present invention can be used to polish any suitable substrate, and is especially useful for polishing substrates comprising silicon nitride, silicon oxide, tungsten and polysilicon.

The polishing compositions of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact adhered the platen and moving relative to the carrier when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

A substrate can be planarized or polished with a polishing composition of the invention using any suitable polishing pad (e.g., polishing surface). Suitable polishing pads include, for example, woven and non-woven polishing pads, grooved or non-grooved pads, porous or non-porous pads, and the like. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope. As used herein and in the following Examples and claims, concentrations reported as parts per million (ppm) are based on the weight of the active component of interest divided by the weight of the composition (e.g., as milligrams of component per kilogram of composition).

EXAMPLE 1

This example illustrates the effect of alkyne diol surfactant concentration on polysilicon removal rate.

Figure 2:
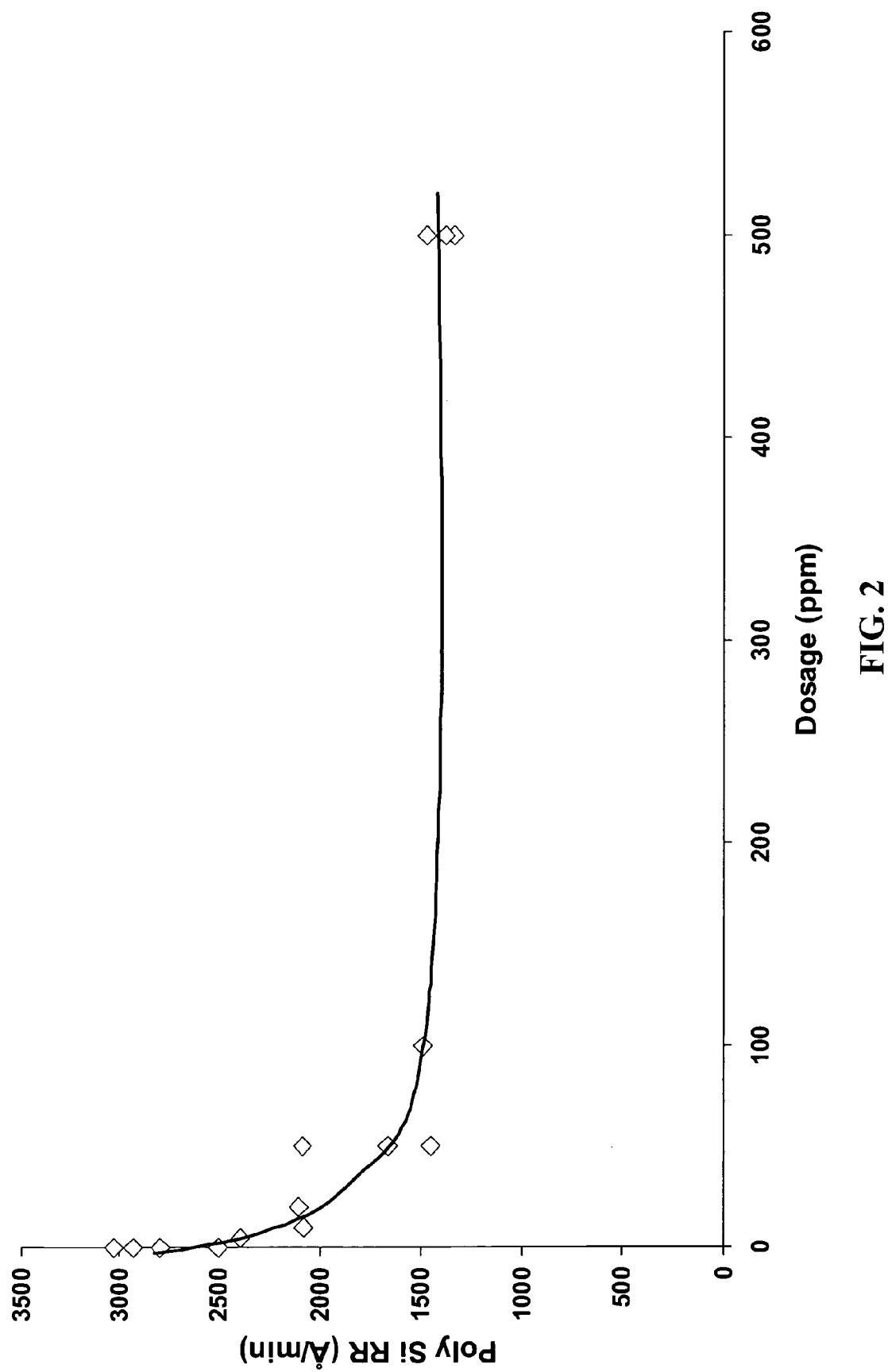
FIG. 2 shows a plot of polysilicon removal versus surfactant concentration obtained by polishing polysilicon blanket wafers with compositions of the present invention.

A number of polishing compositions comprising 0 to 500 ppm of SURFYNOL® 104 alkyne diol surfactant were used to separately chemically-mechanically polish similar polysilicon blanket wafers (1.6 inch squares). Each of the polishing compositions also contained 4.8 wt % colloidal silica (having a mean particle size of 40 nm) in an aqueous carrier having a pH of 2.3, and including 1600 ppm of glycine, 270 ppm of malonic acid, and 560 ppm of potassium sulfate. The polishing was performed (with 1 wt % hydrogen peroxide added to each CMP composition) on a bench-top polisher with an Epic® D100 polishing pad under the following polishing conditions: down-force of 2 psi, platen speed of 115 rpm, carrier speed of 60 rpm, and a slurry feed rate of 125 mL/min. The polysilicon removal rate versus surfactant concentration is plotted in FIG. 2. As can be seen in FIG. 2, the polysilicon removal rate was 2,500 to 3,000 Å/min in the absence of surfactant, and dropped to a stable rate of 1,500 Å/min at a surfactant concentration in the range of 100 ppm to 500 ppm.

EXAMPLE 2

This example illustrates the effectiveness of a polishing composition of the invention, compared to compositions lacking the alkyne diol surfactant, for removal of silicon nitride (SN), TEOS-SiO$_2$ (TS), tungsten (W) and polysilicon (PS).

A composition of the invention comprising 1,000 ppm of SURFYNOL® 104 alkyne diol surfactant 4.8 wt % colloidal silica (having a mean particle size of 40 nm) in an aqueous carrier having a pH of 2.3, and including 1600 ppm of glycine, 270 ppm of malonic acid, and 560 ppm of potassium sulfate, was used to separately chemically-mechanically polish blanket wafers of TEOS, silicon nitride tungsten, and polysilicon. The polishing was performed (with 2 wt % hydrogen peroxide added to the CMP composition) on a bench-top polisher with an Epic® D100 polishing pad under the following polishing conditions: down-force of 3.5 psi, platen speed of 60 rpm, carrier speed of 65 rpm, and a slurry feed rate of 150 mL/min. For comparison purposes, wafers of the same types were polished with three comparative compositions comprising the same formulation, but lacking the alkyne diol. Ex. A included no surfactant. Ex. B utilized the same CMP composition as Ex. A, but included only 0.5 wt % hydrogen peroxide. Ex. C included 1,000 ppm of SILWET® L7280 non-ionic surfactant (an alkoxylated heptamethyltrisiloxane surfactant) in place of the alkyne diol.

Figure 3:
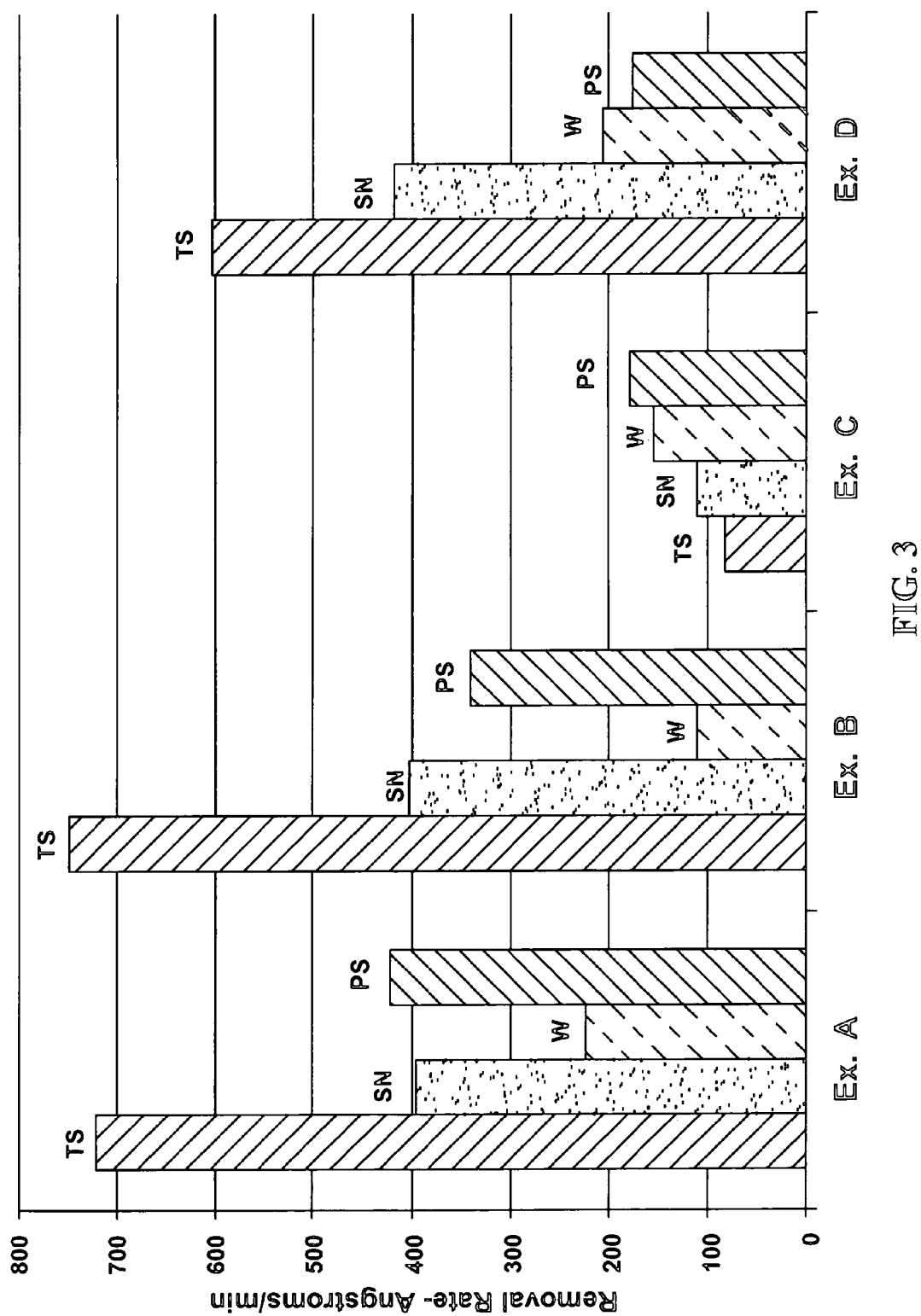
FIG. 3 shows a bar graph of removal rates for TEOS-SiO$_2$ (TS), silicon nitride (SN), tungsten (W), and polysilicon (PS) versus surfactant concentration obtained by polishing blanket wafers of the indicated material with a composition of the invention (Ex. D) and three comparative compositions (Ex. A, Ex. B, and Ex. C).

The observed removal rates versus surfactant concentration are graphed in FIG. 3 for each type of wafer and each composition evaluated. As can be seen in FIG. 3, Ex. D (the composition of the invention) provided good silicon nitride, W, and TEOS removal rates comparable to Ex. A and Ex. B, but with significantly a reduced polysilicon removal rate compared to Ex. A and Ex. B. In contrast, Ex. C (containing SILWET® L7280) suppressed polysilicon removal, but also significantly and undesirably suppressed silicon nitride, tungsten, and TEOS removal.

EXAMPLE 3

This example illustrates the effect of different surfactants on suppression of polysilicon removal.

Figure 4:
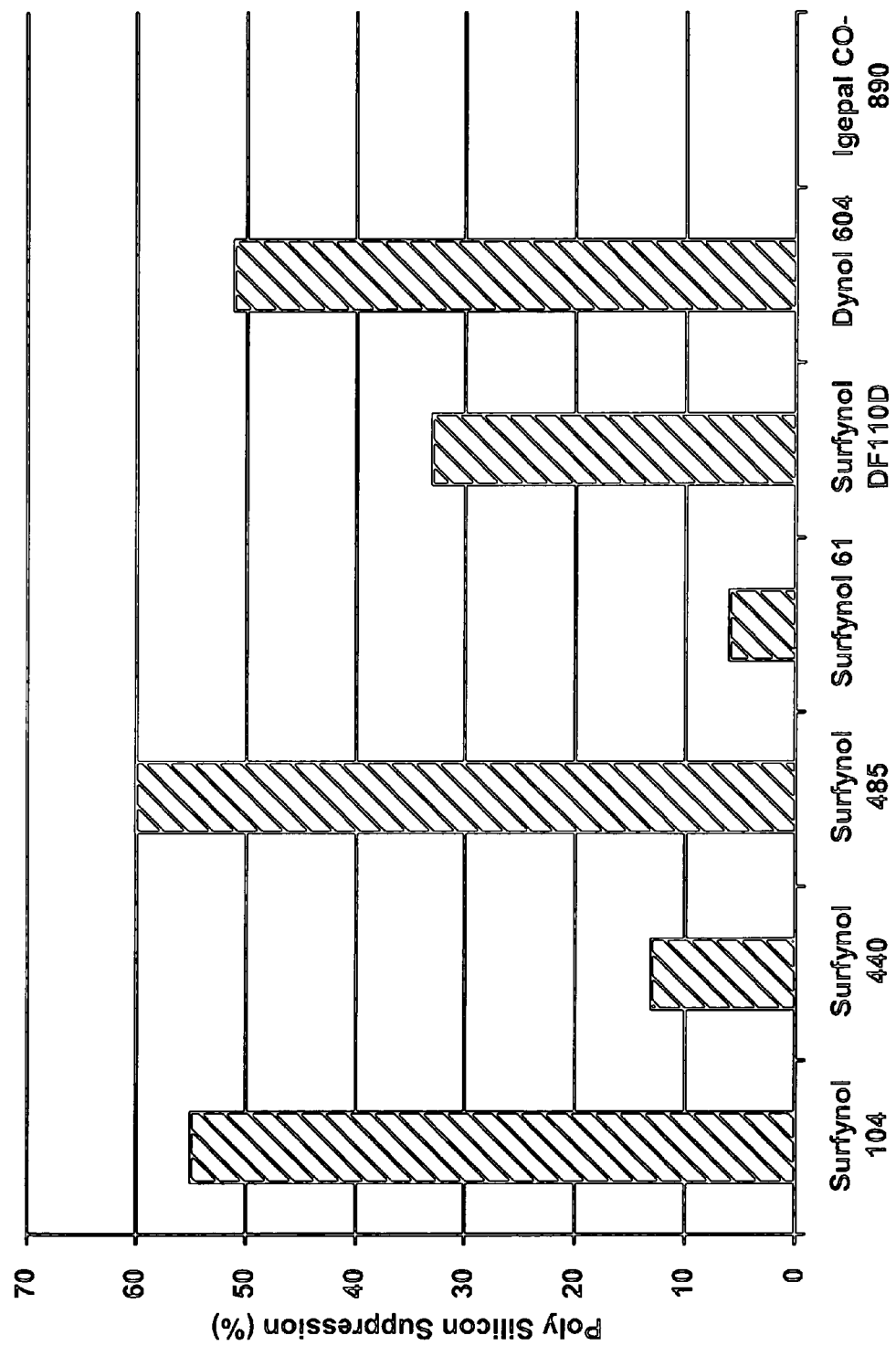
FIG. 4 shows a bar graph of the percentage of polysilicon removal rate suppression obtained by polishing polysilicon blanket wafers with CMP compositions containing different surfactant materials, compared to results obtained with CMP compositions containing no alkyne diol-type surfactant.

A number of polishing compositions comprising 1,000 ppm of various surfactants were used to separately chemically-mechanically polish similar polysilicon blanket wafers (1.6 inch squares). Each of the polishing compositions also contained 4.8 wt % colloidal silica (having a mean particle size of 20 nm) in an aqueous carrier having a pH of 2.3, and including 1600 ppm of glycine, 270 ppm of malonic acid, and 560 ppm of potassium sulfate. The polishing was performed (with 1 wt % hydrogen peroxide added to each CMP composition) on a bench-top polisher with an Epic® D100 polishing pad under the following polishing conditions: down-force of 2 psi, platen speed of 115 rpm, carrier speed of 60 rpm, and a slurry feed rate of 125 mL/min. The surfactants evaluated were SURFYNOL® 104, SURFYNOL® 440, SURFYNOL® 485, SURFYNOL® 61 (comparative alkyne monoalcohol), SURFYNOL® DF110D, DYNOL® 604, and IGEPAL® CO890 (an alkylphenol ethoxylate comparative surfactant). The percentage of polysilicon removal rate suppression obtained with each surfactant concentration is graphed in FIG. 4. The suppression was determined by comparing the rate obtained with surfactant to the rate obtained in the absence of the surfactant. As can be seen in FIG. 4, polysilicon removal rate suppressions in the range of 10% to 50% or greater were obtained with the compositions of the invention, while IGEPAL® CO890 provided no suppression and SURFYNOL® 61 provided less than 10% suppression.

The invention claimed is:

1. A method of polishing a semiconductor substrate to remove silicon nitride in preference to polysilicon from the surface of the substrate; the method comprising abrading a surface of a silicon nitride- and polysilicon-containing substrate with a CMP composition comprising about 0.01 to about 15 percent by weight abrasive particles suspended in an aqueous carrier containing about 10 to about 10,000 ppm of a surfactant comprising an alkyne-diol, an alkyne diol ethoxylate, or a combination thereof, the composition further comprises an additive comprises potassium sulfate, wherein the aqueous carrier has a pH in the range of about 1 to about 4.

2. The method of claim 1 wherein the polishing is performed in the presence of hydrogen peroxide.

3. The method of claim 1 wherein the surfactant in the CMP composition comprises an alkyne diol compound of Formula (I) and/or an ethoxylate thereof comprising about 1 to about 40 moles of ethyleneoxy units per mole of alkyne diol compound;

Formula (I):

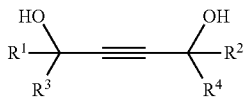

wherein
each of $R^1$ and $R^2$ is independently H or methyl; and
each of $R^3$ and $R^4$ is independently a $C_1$ to $C_{22}$ alkyl group.

4. The method of claim 1 wherein the abrading is accomplished by:
(a) contacting a surface of the substrate with a polishing pad and the CMP composition; and
(b) causing relative motion between the polishing pad and the substrate while maintaining a portion of the CMP composition in contact with the surface between the pad and the substrate for a time period sufficient to abrade silicon nitride from the surface.

5. The method of claim 1 wherein the composition further comprises about 10 to about 100,000 ppm of at least one carboxylic acid-containing additive.

6. The method of claim 5 wherein the at least one carboxylic acid-containing additive comprises malonic acid, glycine, or a combination thereof.

* * * * *